United States Patent [19]

Pavio, Jr. et al.

[11] Patent Number: 4,763,084
[45] Date of Patent: Aug. 9, 1988

[54] PUSH-PUSH DIELECTRIC RESONATOR OSCILLATOR

[75] Inventors: Anthony M. Pavio, Jr., Plano; Mark A. Smith, Dallas, both of Tex.

[73] Assignee: Texas Instruments Incorporated, Dallas, Tex.

[21] Appl. No.: 35,213

[22] Filed: Apr. 9, 1987

Related U.S. Application Data

[63] Continuation of Ser. No. 867,843, May 27, 1986, abandoned.

[51] Int. Cl.$^4$ .............................................. H03B 5/18
[52] U.S. Cl. ........................................ 331/56; 331/76; 331/100; 331/114; 331/117 D
[58] Field of Search ..................... 331/45, 56, 74, 76, 331/77, 96, 99, 100, 102, 107 SL, 114, 117 R, 117 FE, 117 D

[56] References Cited

U.S. PATENT DOCUMENTS

| | | | |
|---|---|---|---|
| 3,939,429 | 2/1976 | Löhn et al. | 331/100 X |
| 4,485,355 | 11/1984 | Scott | 331/117 FE |
| 4,527,130 | 7/1985 | Lütteke | 331/117 D X |
| 4,539,530 | 9/1985 | Mizumura et al. | 331/117 FE |
| 4,677,691 | 6/1987 | Scott | 331/117 FE X |

Primary Examiner—Siegfried H. Grimm
Attorney, Agent, or Firm—Rene' E. Grossman; Leo N. Heiting; Melvin Sharp

[57] ABSTRACT

A push-push broadband dielectric resonator oscillator circuit that operates in the K and Ka band frequency range has two oscillator circuits that oscillate at the same fundamental frequency. An antiphaseal relationship is maintained between the two oscillators through the use of a dielectric resonator and the desired frequency is obtained by vectorially combining the output signals of the two oscillators that have the antiphase relationship to obtain an output frequency that is twice the fundamental frequency of operation of each of the individual dielectric resonator oscillator circuits.

4 Claims, 2 Drawing Sheets

PUSH-PUSH DIELECTRIC RESONATOR OSCILLATOR

This application is a continuation, of application Ser. No. 867,843, filed May 27, 1986 and now adandoned.

BACKGROUND OF THE INVENTION

This invention relates to push-push oscillator circuits for operation in the range of 20 to 40 GHZ and more particular to push-push dielectric resonator oscillators.

In the past, a variety of microwave components which employ dielectric resonators have been developed due to the availability of low cost temperature stable, high permittivity materials. These high permittivity materials are available from several manufacturers with a variety of dielectric constants and temperature coefficients. Their use maximizes the performance to size ratio for many filters and oscillators, thus enabling low cost and manufacturing components to be realized. They are therefore the logical choice for many fixed frequency receiver/transmitter low noise oscillator applications.

Dielectric resonator oscillators can generally be classified as being either reflection or feedback type oscillators. Reflection type oscillators which couple a dielectric resonator to the output circuit one half wavelength away from the transistor (such as a field effect transistor), exhibit significantly improved FM noise performance and frequency stability over that of a conventional oscillator. Reflection oscillators, however, do not achieve the low FM noise performance and high stability characteristics of feedback dielectric resonator oscillator circuits since optimum load circuit Q is not obtained. This condition exists because the gate/source circuit which dominates the frequency stability characteristic is constructed using low Q elements and is not strongly influenced by the presence of the resonator at the device output.

An alternate circuit which yields high stability and low FM noise is a series feedback oscillator such as that shown in U.S. Pat. No. 4,539,530. The series feedback oscillator circuit usually consists of a high gain, low noise field effect transistor. A terminated 50 ohm microstrip transmission line connected to the field effect transistor's gate. A coupled dielectric resonator. A shunt reactance connected to the field effect transistor source, and an impedance transfomer such as a transmission line connected to the drain port.

Critical to the performamce of the series feedback oscillator circuits is the placement of the dielectric resonator on the gate circuit of the field effect transistor where it is isolated from the output through a very low drain to gate capacitance inherent in field effect transistors. This isolation minimizes interaction between the oscillator's output and input circuits resulting in a vey high loaded circuit Q.

However, at frequencies above 20 GHz it is nearly impossible to effectively manufacture accurate, high Q resonators. Physical handling is also a major problem since a 20 GHz resonator is in the order of 1 mm in diameter. A completely different set of difficulties arises during the design of a Ka-band dielectric resonator oscillator. Since the gain of even the best field effect transistors currently available is marginal at frequencies between 26 and 40 GHz, excessive resonator coupling is required and this thus destroys the inherent Q and spectral purity of the oscillator.

SUMMARY OF THE INVENTION

A push-push broadband dielectric resonator oscillator circuit that operates in the K and Ka band frequency range has two oscillator circuits that oscillate at the same fundamental frequency. An antiphaseal relationship is maintained between the two oscillators through the use of a dielectric resonator and the desired frequency is obtained by vectorially combining the output signals of the two oscillators that have the antiphase relationship to obtain an output frequency that is twice the fundamental frequency of operation of each of the individual dielectric resonator oscillator circuits.

It is an object of the invention to provide a dielectric resonator oscillator for operating in the Ka band frequency range that employs a push-push oscillator design.

It is another object of the invention to provide a dielectric resonator oscillator that utilizes an even harmonic of the operating frequency as the desired frequency.

These and other advantages and objects of the invention will be apparent from reading the specification in conjunction with the drawings in which:

DESCRIPTION OF THE EMBODIMENTS

Figure 1:
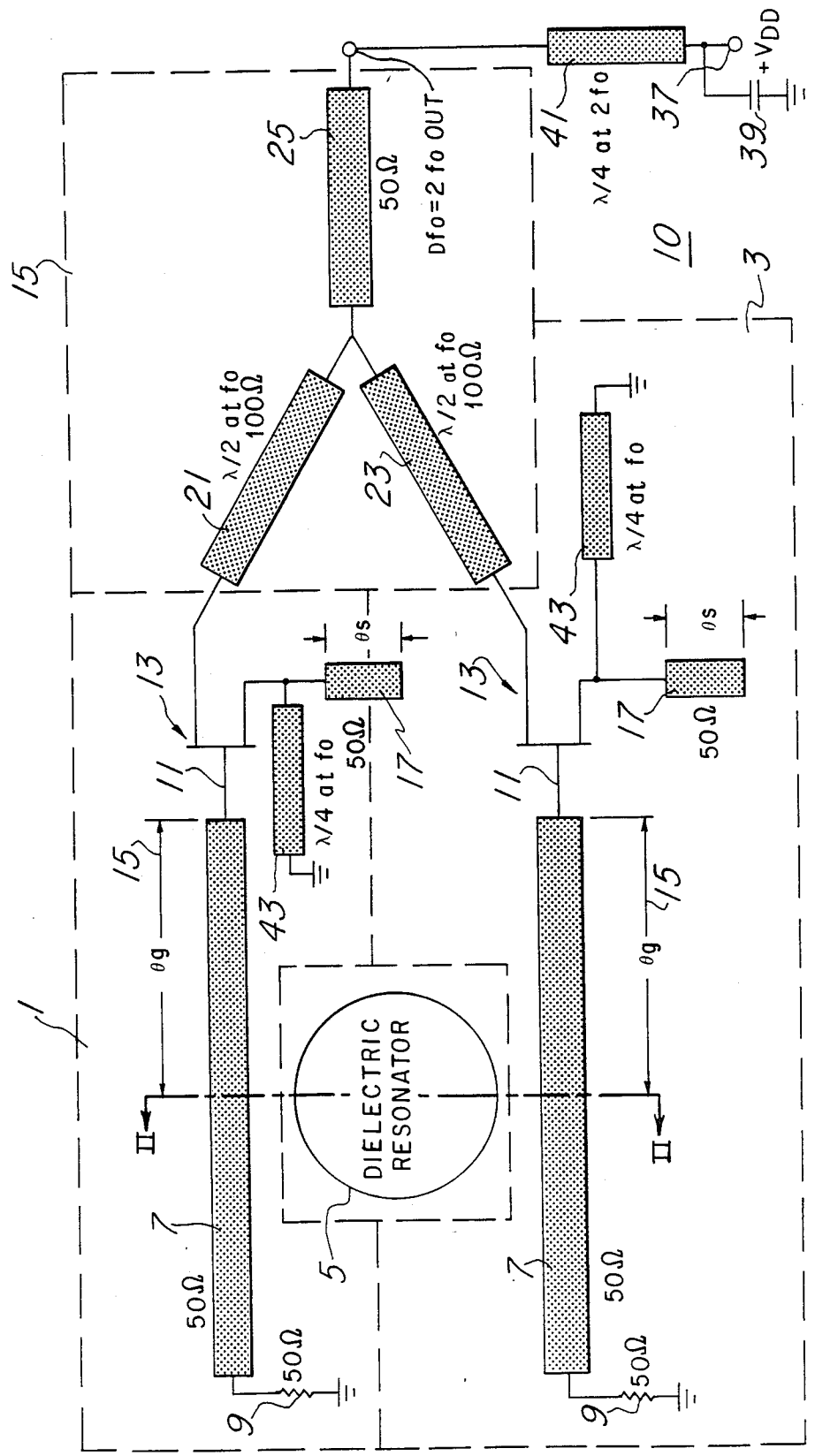
FIG. 1 is a schematic diagram of the dielectric resonator push-push oscillator according to the invention.

In FIG. 1 to which reference should now be made, there is shown a push-push dielectric resonator oscillator circuit 10 that includes dual oscillators 1 and 3 which are designed to operate at the same frequency but in an antiphase, 180 degree, relationship with each other. Each oscillator has a terminated transmission line 7 whose length is selected to provide a 50 ohm impedance to a signal at a frequency of operation $F_O$. The transmission line 7 is terminated to ground via a 50 ohm resistor 9 on one end, and connected to the gate 11 of a field effect transistor 13 at the other end. The effect of the transmission line 7, the resistor 9 and a dielectric resonator 5 provides a gate matching network having electric length in degrees defined by $\theta_G$. This is indicated by dimension line 15. Additionally, a second transmission line 17 is connected to the source of each field effect transistor 13 and provides for source matching as is defined by $\theta_S$ which is the electric length of the source matching network in degrees. $\theta_G$ defines the relationship of the dielectric resonator 5 to the oscillator circuits 1 and 3 by ensuring that the frequency of oscillation of the first push-push dielectric resonator circuit 1 has an antiphaseal relationship with the second push-push dielectric resonator oscillator circuit 3 and it completes the resonance circuit to ensure oscillation of the push-push dielectric resonator circuits 1 and 3.

The output of each push-push dielectric resonator circuit is applied to a combining circuit where the outputs are vectorially combined such that the odd harmonics of the frequency of operation. $F_O$, are cancelled, leaving the even harmonics with the second harmonic $2F_O$. In the case of FIG. 1, being equal to the desired frequency of operation $DF_O$. This is accomplished by having an impedance matching network of a 100 ohm transmission line 21 connected to the output or drain of the first transistor and a second 100 ohm transmission line 23 connected to the output, or drain of the second transistor 13. The two transmission lines 21 and 23 have a length of one half wavelength at $F_O$ and are combined into the input of a second transmission line 25. The output of which is the desired frequency of operation $DF_O$.

DC biasing is provided by connecting the circuit to VDD at 37 through a filter network that includes a capacitor 39 connected to ground and a transmission line 41 that is tuned. In the case of FIG. 1 to the second harmonic of the frequency of operation by having its length selected to be a quarter wavelength. Additionally, biasing transmission lines 43 are connected between the source and ground of the field effect transistor 13, completing when connected to a VDD power source the DC circuit.

Figure 2:
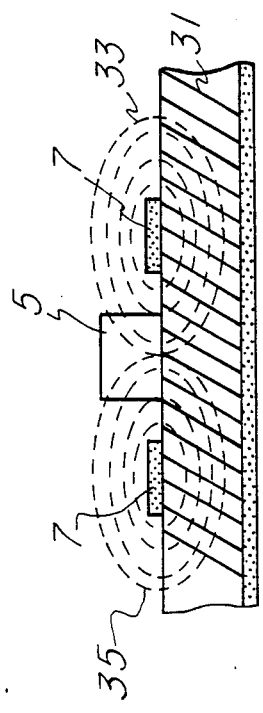
FIG. 2 is a cross sectional view of the dielectric resonator according to the invention.

The push-push dielectric resonator oscillator 10 of FIG. 1 can be a monolithic circuit which is shown in FIG. 2 as a sectional view taken from section lines II, II and illustrates the magnetic coupling via flux lines 33 and 35 between the transmission lines 7 and the dielectric resonator 5. These circuit elements are mounted on and/or deposited on a substrate 31 together with the field effect transistors 13 and transmission lines 7, 17, 21, 23, 25, and 43.

Figure 3:
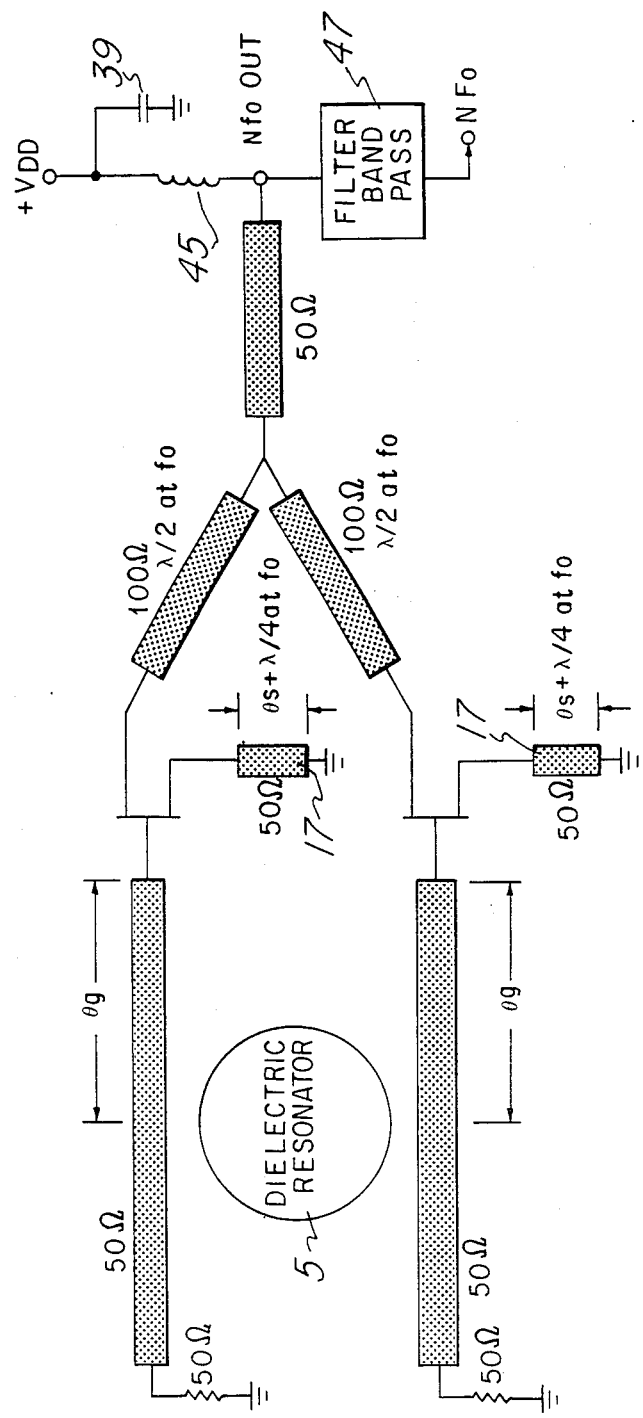
FIG. 3 is an alternate diagram of the DC biasing for the push-push dielectric resonator according to the invention.

FIG. 3 is an alternate embodiment of FIG. 1 in which the transmission lines 17 have an extended length of $\lambda/4$ at the frequency of operations and are connected to ground. This achieves the biasing that was originally provided by the transmission lines 43. Additionally, in lieu of a transmission line 41, a choke 45 can as well be implemented. Because of the operation of the circuit, the odd harmonics are cancelled out. The remaining frequencies are the even harmonics of $F_O$. In the embodiment of FIG. 1, $2F_O$ was taken to be the $DF_O$ or desired frequency. However, as was discussed in the Background of the Invention, as the frequency goes up higher, the size of the dielectric resonator 5 gets smaller. Therefore, for extremely high frequencies, it may be advantageous to filter out all but one of the even harmonics and select a desired harmonic other than the second hamonic for the frequency of operation. This can easily be done by use of bandpass filter 47.

Table 1 provides the resonator's diameter when compared with resonator thickness at the fundamental frequency and the second harmonic of the fundamental frequencies for a variety of dielectric resonators for the source matching network, $\theta_S$ in degrees of 30 degree and the gate matching network, $\theta_G$ of 108 degrees.

TABLE 1

| $\theta_S = 30°$ | Resonator |
| | Er = 38 |
| $\theta_G = 108°$ | Frequency |
| | = GHz |
| RESONATOR | RESONATOR |

TABLE 1-continued

| DIAMETER | THICKNESS | FO | 2FO |
| --- | --- | --- | --- |
| .133" | .062" | 16.36 | 32.72 |
| .133" | .046" | 17.95 | 35.90 |
| .255" | .085" | 10.06 | 20.12 |

What is claimed is:

1. A push-push dielectric resonator oscillator circuit, comprising:
    a first oscillator means for generating a first signal at a first frequency and phase;
    a second oscillator means for generating a second signal at the first frequency and at a second phase;
    a resonator means for maintaining an antiphase relationship between the first signal and the second signal;
    combining means for vectorially combining the first and second signals to obtain an output signal at a second frequency; and
    the first and second oscillator means each include a field effect transistor circuit including a field effect transistor having a gate, a drain and a source, a resonating circuit tuned to resonate at the first frequency as its fundamental frequency connected to the gate of the field effect transistor, a network circuit tuned for impedance matching at the first frequency and connected to the source, and an output circuit tuned for impedance matching at the first frequency and connected to the drain.

2. The push-push dielectric resonator circuit according to claim 1, wherein the resonating circuit comprises:
    a first and second termination circuit;
    a first transmission line having a first length and connected to the gate of the first transistor on one end and to the first termination circuit on the other end;
    a second transmission line having the first length and connected to the gate of the second transistor on one end and to the second termination circuit on the other end, the second transmission line being located in a predetermined positional relationship to the first transmission line; and
    a dielectric resonator means for connecting magnetic energy between the first transmission line and the second transmission line.

3. The push-push dielectric resonator oscillator circuit according to claim 2, wherein the dielectric resonator further ensures antiphaseal relationship between the first oscillator means and the second oscillator means.

4. The push-push dielectric resonator oscillator circuit according to claim 1 wherein the combining means comprises: a first and second transmission line having a length equal to a half wavelength of the first frequency joined together at one end with the opposite ends connected to the drains of the field effect transistors of the first oscillator means and the second oscillator means, and a third transmission line connected to the joint of the first and second transmission line at one end with said output being provided at the other end.

* * * * *